(12) United States Patent
Moon et al.

(10) Patent No.: US 10,804,425 B2
(45) Date of Patent: Oct. 13, 2020

(54) GROWTH SUBSTRATE INCLUDING MICRO-LIGHT EMITTING DIODE CHIPS AND METHOD OF MANUFACTURING LIGHT EMITTING DIODE DISPLAY USING THE SAME

(71) Applicants: LG DISPLAY CO., LTD., Seoul (KR); LG ELECTRONICS INC., Seoul (KR)

(72) Inventors: Joonkwon Moon, Paju-si (KR); Hwankuk Yuh, Paju-si (KR); Taesu Oh, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/037,174

(22) Filed: Jul. 17, 2018

(65) Prior Publication Data
US 2019/0157502 A1 May 23, 2019

(30) Foreign Application Priority Data
Nov. 20, 2017 (KR) .......................... 10-2017-0154808

(51) Int. Cl.
*H01L 33/00* (2010.01)
*H01L 27/15* (2006.01)
(Continued)

(52) U.S. Cl.
CPC ...... *H01L 33/0093* (2020.05); *H01L 25/0753* (2013.01); *H01L 27/153* (2013.01);
(Continued)

(58) Field of Classification Search
CPC ............. H01L 33/0079; H01L 25/0753; H01L 27/156; H01L 33/0093
See application file for complete search history.

(56) References Cited

U.S. PATENT DOCUMENTS

2010/0259164 A1* 10/2010 Oohata ............... H01L 25/0753
313/505
2014/0145218 A1 5/2014 Kim et al.
(Continued)

FOREIGN PATENT DOCUMENTS

EP 2 367 203 A1 9/2011
JP 2002-304903 A 10/2002
(Continued)

OTHER PUBLICATIONS

Extended European Search Report dated Jan. 22, 2019, issued in corresponding European Patent Application No. 18175664.4.

*Primary Examiner* — Daniel Luke
(74) *Attorney, Agent, or Firm* — Morgan, Lewis & Bockius LLP

(57) ABSTRACT

A growth substrate including micro-light emitting diode (LED) chips and a method of manufacturing a light emitting diode display using the growth substrate are disclosed. The growth substrate includes LED chips. The LED chips are divided into n groups each including p LED chips, where each of the n and p is an integer equal to or greater than 2. At least two of the n groups are adjacent to each other. Each of the n includes a first LED chip having a directionality toward a first direction and a second LED chip having a directionality toward a second direction different from the first direction.

9 Claims, 18 Drawing Sheets

(51) Int. Cl.
*H01L 25/075* (2006.01)
*H01L 33/30* (2010.01)

(52) U.S. Cl.
CPC ............ *H01L 27/156* (2013.01); *H01L 33/30* (2013.01); *H01L 2933/0033* (2013.01)

(56) References Cited

U.S. PATENT DOCUMENTS

2015/0371585 A1  12/2015  Bower et al.
2017/0317243 A1  11/2017  Park et al.

FOREIGN PATENT DOCUMENTS

| | | |
|---|---|---|
| JP | 2006-041283 A | 2/2006 |
| JP | 2014-150292 A | 8/2014 |
| KR | 10-2014-0118782 A | 10/2014 |
| KR | 10-2017-0020485 A | 2/2017 |
| KR | 10-2017-0124154 A | 11/2017 |
| WO | 2014/149864 A1 | 9/2014 |

\* cited by examiner (a)

(b)

(c)

GROWTH SUBSTRATE INCLUDING MICRO-LIGHT EMITTING DIODE CHIPS AND METHOD OF MANUFACTURING LIGHT EMITTING DIODE DISPLAY USING THE SAME

BACKGROUND

Field of the Disclosure

The present disclosure relates to a growth substrate including micro-light emitting diode chips and a method of manufacturing a light emitting diode display using the growth substrate.

Discussion of the Related Art

Various display devices have replaced heavier and larger cathode ray tubes (CRTs). Examples of the display devices may include a liquid crystal display (LCD), a field emission display (FED), a plasma display panel (PDP), and an organic light emitting diode (OLED) display.

In more detail, an OLED display is a self-emission display configured to emit light by exciting an organic compound. The OLED display does not require a backlight unit used in a liquid crystal display and thus has advantages of a thin profile, lightness in weight, and a simpler manufacturing process. The OLED display can be also manufactured at a low temperature and has a fast response time of 1 ms or less, low power consumption, a wide viewing angle, and a high contrast. Thus, the OLED display has been widely used.

However, because the OLED display uses organic light emitting diodes formed of an organic material, the OLED display is weak to moisture and oxygen. To solve the weakness, an encapsulation technology is applied to the OLED display. However, because it is difficult to achieve sufficient encapsulation of a required degree, there is a difficulty in securing product reliability.

Research on a light emitting diode (LED) display using light emitting diodes (LEDs) formed of an inorganic material is being recently carried. Because the LEDs have high light conversion efficiency, the LEDs are eco-friendly elements which have very low energy consumption and are semi-permanent.

The LEDs have been adopted as light sources of a backlight unit constituting a liquid crystal display. However, in this instance, because light provided by the backlight unit passes through a liquid crystal display panel, etc., a loss of the light is inevitable. Therefore, there is a limit to improving emission efficiency beyond a predetermined level. Further, a display device using the LEDs as the light sources is regarded as a liquid crystal display and is difficult to be regarded as the LED display.

An LED display described in embodiments of the disclosure is a display device configured to dispose at least one LED in each pixel on a thin film transistor substrate. The display device can use advantages of the LEDs without a reduction in emission efficiency. Thus, efforts are being made to commercialize the display device.

To manufacture an LED display of a high resolution having high pixel per inch (PPI), an effective method needs to be proposed to mount micro-LEDs of several micro-size in a predetermined area of the thin film transistor substrate. In addition, an effective method needs to be proposed to manufacture a large-sized LED display using a relatively small-sized growth substrate on which LEDs are grown.

SUMMARY

Accordingly, embodiments of the present disclosure are directed to a growth substrate including micro-light emitting diode chips and a method of manufacturing a light emitting diode display using the same that substantially obviate one or more of the problems due to limitations and disadvantages of the related art.

An aspect of the present disclosure is to provide a growth substrate and a method of manufacturing a light emitting diode (LED) display using the same capable of efficiently manufacturing a relatively large-sized LED display using a relatively small-sized growth substrate.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a growth substrate comprises light emitting diode (LED) chips, wherein the LED chips are divided into n groups each including p LED chips, where each of the n and p is an integer equal to or greater than 2, wherein at least two of the n groups are adjacent to each other, wherein each of the n groups includes a first LED chip having a directionality toward a first direction and a second LED chip having a directionality toward a second direction different from the first direction.

In another aspect, a method of manufacturing a light emitting diode display comprises providing a growth substrate on which light emitting diode (LED) chips are grown, the LED chips being at least divided into first to fourth groups, and providing a transfer substrate on which pixels having a preset pitch are arranged, wherein the first to fourth groups are arranged in a matrix, wherein each of the first to fourth groups includes a first LED chip having a directionality toward a first direction and a second LED chip having a directionality toward a second direction different from the first direction.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles.

DETAILED DESCRIPTION

Reference will now be made in detail to embodiments of the disclosure, examples of which are illustrated in the accompanying drawings. Wherever possible, the same reference numbers will be used throughout the drawings to refer to the same or like parts. Detailed descriptions of known arts will be omitted if such may mislead the embodiments of the disclosure.

The terms "first", "second", etc. may be used to describe various components, but the components are not limited by such terms. The terms are used only for the purpose of distinguishing one component from other components. For example, a first component may be designated as a second component, and vice versa, without departing from the scope of the present disclosure.

First Embodiment

Figure 1:
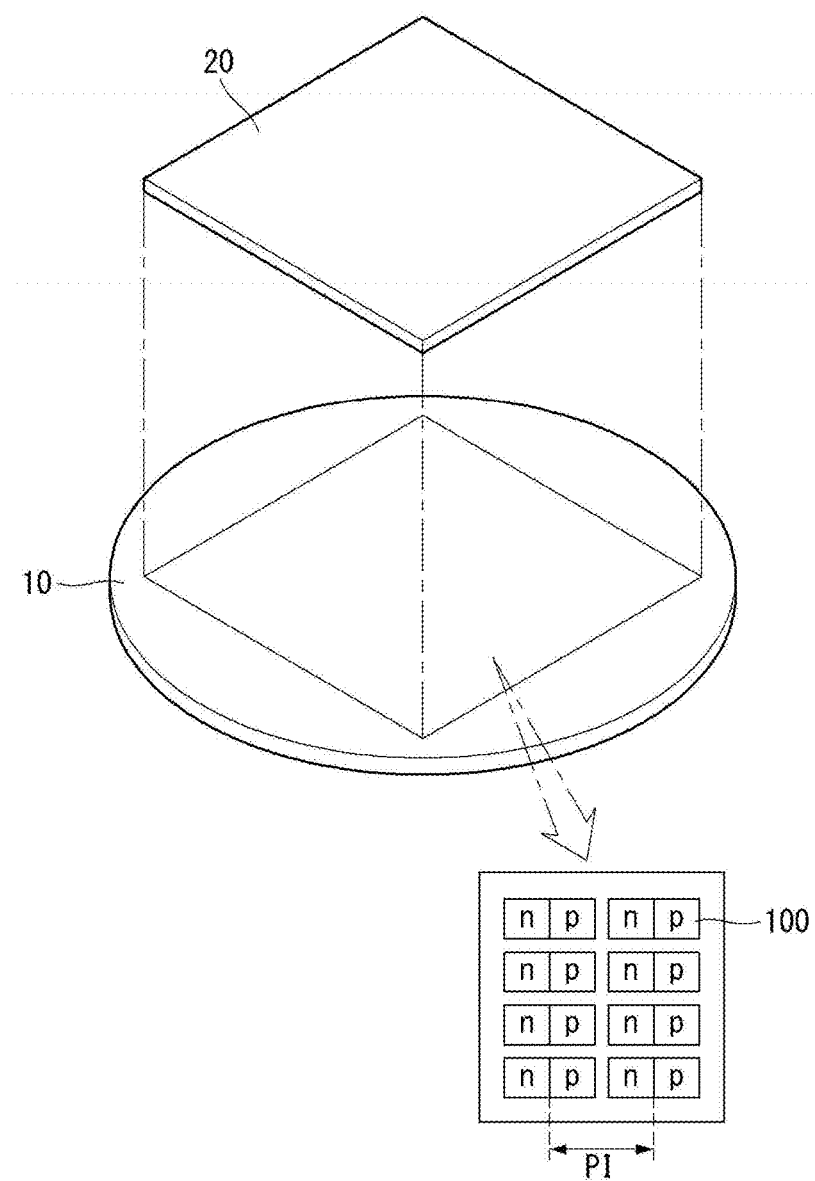
FIGS. 1, 2A, and 2B illustrate a method of manufacturing a light emitting diode (LED) display in time series.
Figure 2A:
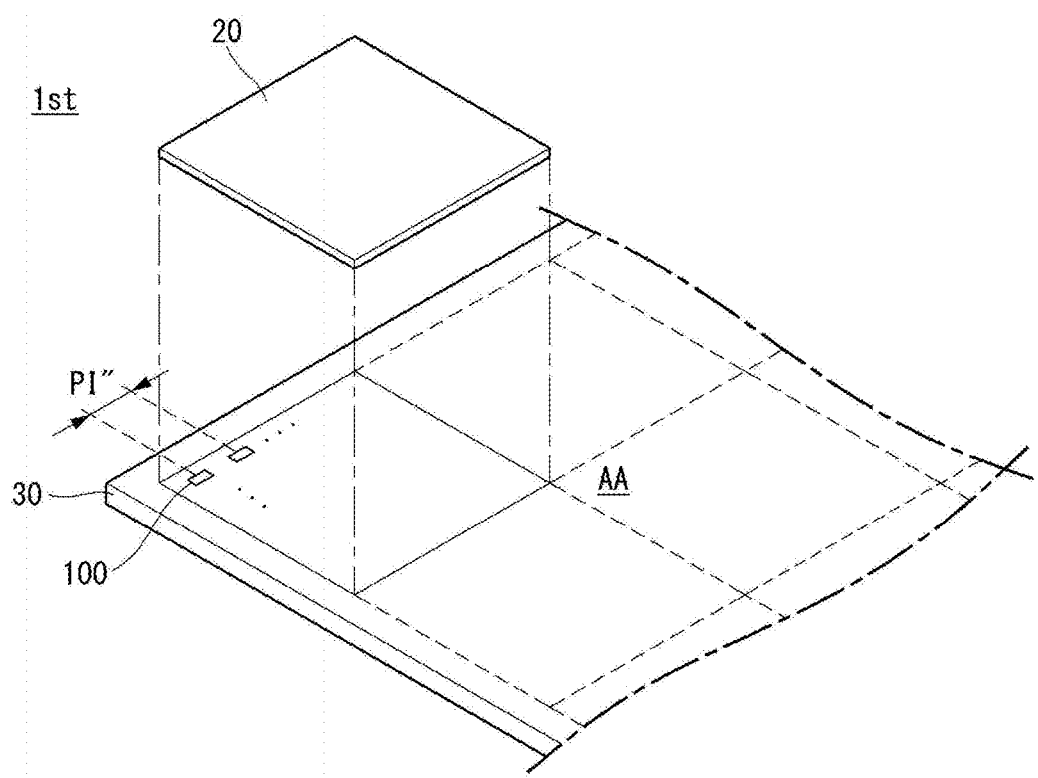
Figure 2B:
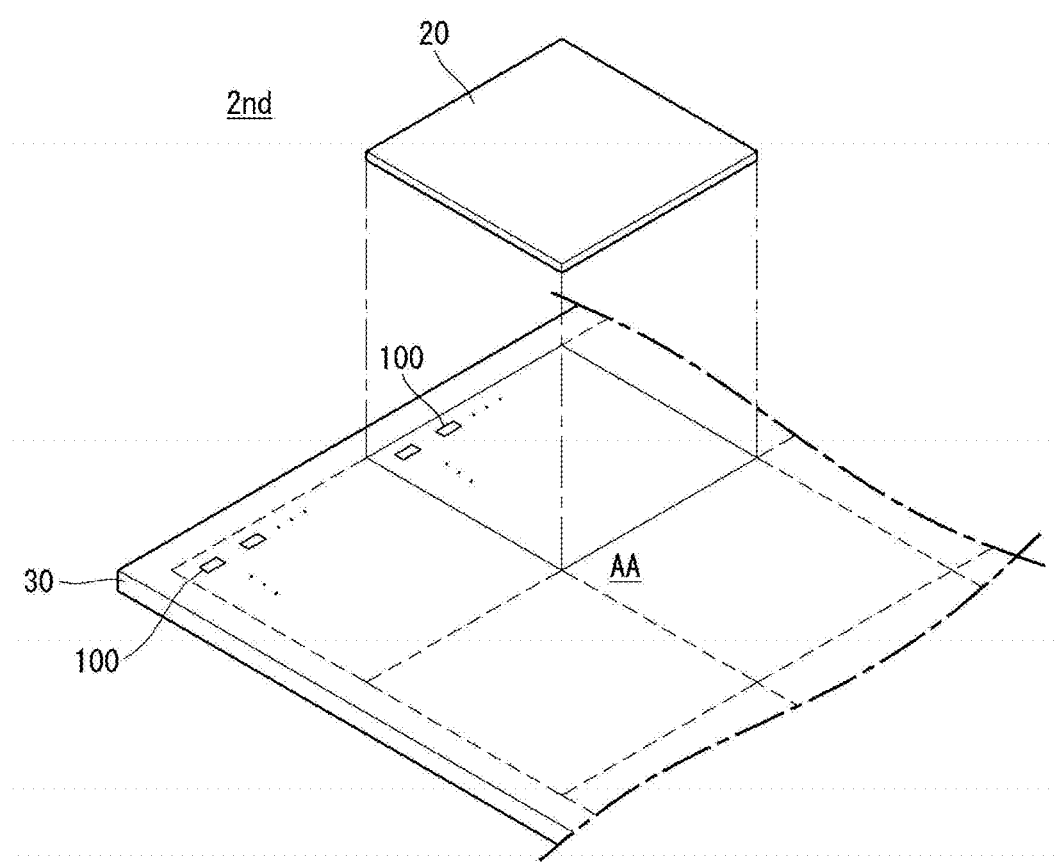

FIGS. 1, 2A, and 2B illustrate a method of manufacturing a light emitting diode (LED) display in time series.

Referring to FIGS. 1, 2A, and 2B, a growth substrate 10, a transfer substrate 30, and a donor substrate 20 are provided to manufacture an LED display.

The growth substrate 10 is used as a base for growing LED chips 100. The growth substrate 10 may be selected from among silicon (Si), sapphire, silicon carbide (SiC), gallium arsenide (GaAs), gallium nitride (GaN), gallium phosphide (GaP), indium phosphide (InP), zinc oxide (ZnO), spinel ($MgAl_2O_4$), magnesium oxide (MgO), lithium metaaluminate ($LiAlO_2$), aluminum nitride (AlN), and lithium gallate ($LiGaO_2$). However, embodiments are not limited thereto.

A plurality of micro-LED chips (hereinafter referred to as "LED chips") 100 is grown on the growth substrate 10. The LED chip 100 is a semiconductor light emitting element that emits light energy of various wavelengths by applying an electrical signal using characteristics of a chemical semiconductor. The LED chip 100 may have a small length, breadth, or height of several micro-size.

The LED chip 100 includes a first semiconductor layer, a second semiconductor layer, and an active layer. The first semiconductor layer may be implemented as a p-type semiconductor layer. The first semiconductor layer may be implemented as a semiconductor compound, for example, II-IV compound semiconductor and III-V compound semiconductor. The first semiconductor layer may be formed as a single layer or a plurality of layers. The first semiconductor layer may include a semiconductor material having a composition formula of $In_xAl_yGa_{1-x-y}N$, where $0 \leq x \leq 1$, $0 \leq y \leq 1$, and $0 \leq x+y \leq 1$. However, embodiments are not limited thereto. For example, the first semiconductor layer may be selected from among GaN, AlN, AlGaN, InN, InAlGaN, AlInN, AlGaAs, GaP, GaAs, GaAsP, AlGaInP, etc. and may be doped with a p-type dopant such as Mg, Zn, Ca, Sr, and Ba.

The second semiconductor layer may be implemented as an n-type semiconductor layer. The second semiconductor layer may be implemented as a semiconductor compound, for example, II-IV compound semiconductor and III-V compound semiconductor. The second semiconductor layer may be formed as a single layer or a plurality of layers. The second semiconductor layer may include a semiconductor material having a composition formula of $In_xAl_yGa_{1-x-y}N$, where $0 \leq x \leq 1$, $0 \leq y \leq 1$, and $0 \leq x+y \leq 1$. However, embodiments are not limited thereto. For example, the second semiconductor layer may be selected from among GaN, AlN, AlGaN, InN, InAlGaN, AlInN, AlGaAs, GaP, GaAs, GaAsP, and AlGaInP, etc. and may be doped with an n-type dopant such as Si, Ge, Sn, Se, and Te.

The active layer is a layer where holes injected through the first semiconductor layer and electrons injected through the second semiconductor layer meet. Hence, the active layer emits light by a difference between band gaps of energy bands depending on a formation material of the active layer. The active layer may selectively include a single quantum well (SQW) structure, a multi-quantum well (MQW) structure, a quantum wire structure, or a quantum dot structure. The active layer may be composed of a compound semiconductor. For example, the active layer may be implemented as at least one of II-IV compound semiconductor and III-V compound semiconductor.

The LED chips 100 are arranged in parallel with one another in one direction on the growth substrate 10. Namely, extension directions of the LED chips 100 that are adjacent to each other are parallel to each other. A pitch PI between the adjacent LED chips 100 is set to as small a pitch as possible in the process. Namely, it is preferable that a large number of LED chips 100 are integrated on the small-sized growth substrate 10, in order to reduce the manufacturing cost of the growth substrate 10.

The transfer substrate 30 is a substrate constituting the LED display, and a plurality of pixels is arranged on the transfer substrate 30. An area of the transfer substrate 30 in which the plurality of pixels is arranged may be defined as an active area AA. At least one LED chip 100 is finally arranged on each pixel. Signal lines and electrodes for applying driving signals to the LED chips 100 may be arranged on the transfer substrate 30. When the LED display is implemented as an active matrix LED display, the transfer substrate 30 may further include thin film transistors respectively assigned to the plurality of pixels. The LED chips 100 transferred to the adjacent pixels are arranged to be spaced from each other by a predetermined pitch PI". The pitch PI" between the adjacent LED chips 100 among the LED chips 100 transferred to the transfer substrate 30 may be properly selected in consideration of display characteristics, the arrangement of elements, and the like.

The donor substrate 20 is used to transport the LED chips 100 from the growth substrate 10 to the transfer substrate 30. The donor substrate 20 selectively picks up the LED chips 100 from the growth substrate 10. The donor substrate 20 selectively picks up only the LED chips 100 at a predetermined location of the growth substrate 10 and respectively transfers the picked-up LED chips 100 to corresponding pixels of the transfer substrate 30. For example, because the donor substrate 20 has particular adhesive (or adsorption) properties, the donor substrate 20 can selectively pick up the LED chips 100 at a predetermined location of the growth substrate 10 due to an adhesive force of the donor substrate 20. Here, the step of irradiating laser to the back surface of the growth substrate 10 may proceed in order to separate the grown LED chips 100 from the growth substrate 10. For example, a release layer may be provided between the growth substrate 10 and the LED chips 100, and the growth substrate 10 and the LED chips 100 can be separated by irradiating a laser onto the release layer. Next, the donor substrate 20 can transfer the picked-up LED chips 100 to corresponding pixels of the transfer substrate 30 by releasing the adhesive force of the donor substrate 20. For example, the transfer substrate 30 may have particular adhesive (or adsorption) properties, and the donor substrate 20 and the picked-up LED chips 100 can be separated by an adhesive force of the transfer substrate 30. Here, the adhesive force of the transfer substrate 30 may be bigger than the adhesive force of the donor substrate 20. Alternatively, thermal and chemical characteristics may be used to release the adhesive force.

A reason to selectively pick up the LED chips 100 using the donor substrate 20 is because there is a difference between the pitch PI between the LED chips 100 grown on the growth substrate 10 and the required pitch PI" between the LED chips 100 transferred to the transfer substrate 30. More specifically, because as many LED chips as possible in the process need to be grown on the growth substrate 10 for the purpose of a reduction in the manufacturing cost of the LED display, the pitch PI between the LED chips 100 grown on the growth substrate 10 is relatively narrow. On the other hand, because the LED chips 100 finally transferred to the transfer substrate 30 needs to be spaced from each other by a pixel pitch, the pitch PI" between the LED chips 100 on the transfer substrate 30 is relatively wide. The donor substrate 20 selectively picks up the LED chips 100 corresponding to a target pixel pitch among the LED chips 100 grown on the growth substrate 10. Hence, a pitch between the adjacent LED chips 100 among the simultaneously picked-up LED chips 100 corresponds to the pitch PI" between the adjacent LED chips 100 finally transferred to the pixels.

As another example, only some of the LED chips 100 which are selectively picked up by the donor substrate 20 may be transferred to the transfer substrate 30, if necessary or desired. Namely, only the LED chips 100 selected among the picked-up LED chips 100 may be transferred to the transfer substrate 30. In this instance, the pitch PI between the LED chips 100 grown on the growth substrate 10 may be equal to or different from a pitch PI' between the LED chips 100 picked up by the donor substrate 20. Further, the pitch PI' between the LED chips 100 picked up by the donor substrate 20 may be equal to or different from the pitch PI" between the LED chips 100 finally transferred to the pixels.

The transfer substrate 30 may be provided to have a relatively larger size than the donor substrate 20. More specifically, the active area AA of the transfer substrate 30 may be provided to be larger than an area of the donor substrate 20. In this instance, a pick-up/transfer operation needs to be repeatedly performed a number of times corresponding to a difference between the active area AA and the area of the donor substrate 20, in order to respectively transfer the LED chips 100 to all the pixels arranged in the active area AA. FIGS. 2A and 2B illustrate two transfer operations using the donor substrate 20 in time series.

Figure 3:
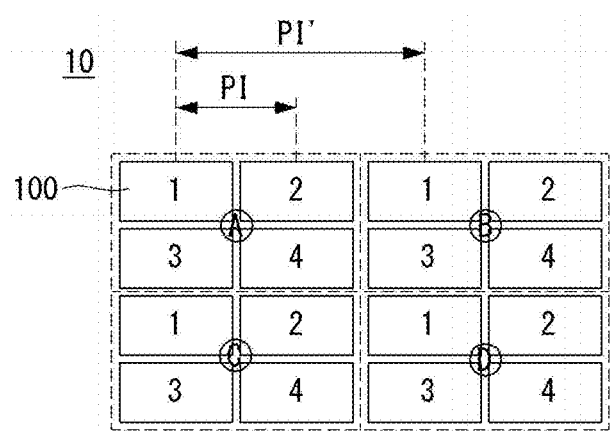
FIG. 3 schematically illustrates a growth substrate according to a first example embodiment on which LED chips are grown.
Figure 4:
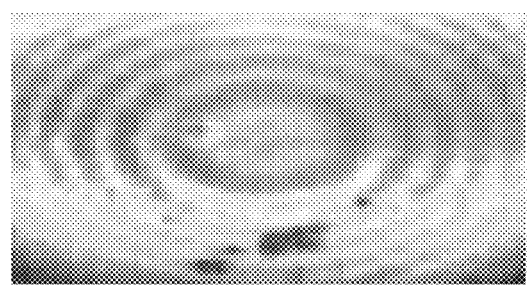
FIG. 4 schematically illustrates a wavelength distribution inside a growth substrate.

FIG. 3 schematically illustrates a growth substrate according to a first example embodiment on which LED chips are grown. FIG. 4 schematically illustrates a wavelength distribution inside a growth substrate. FIGS. 5A to 5D illustrate a method of manufacturing an LED display in time series. FIG. 6 schematically illustrates a wavelength distribution inside a transfer substrate in a structure shown in FIG. 5D.

Referring to FIG. 3, the plurality of LED chips 100 of micro-size is formed on the growth substrate 10 through a growth process. Hereinafter, an example where sixteen (=4×4) LED chips 100 are arranged on the growth substrate 10 is described for convenience of explanation. As described above, a separation pitch PI between the LED chips 100 on the growth substrate 10 may be set to as small a pitch as possible in the process.

In the first embodiment, the LED chips 100 grown on the growth substrate 10 are arranged in parallel with one another with predetermined directionality. For example, when a first LED chip 100 is arranged with directionality toward a first direction, a second LED chip 100 is also arranged with directionality toward the first direction. Hence, the LED chips 100 grown on the growth substrate 10 with predetermined directionality can be selectively picked up by the donor substrate 20 and transferred to the pixels on the transfer substrate 30 with predetermined directionality (for example, the first direction).

The directionality of the LED chip 100 may be defined as a direction in which a current flows. For example, when the LED chip 100 has a P-N junction structure, a direction from a first semiconductor layer to a second semiconductor layer in which a current flows may be defined as arrangement directionality of the LED chip 100. As another example, when the LED chip 100 has a first electrode connected to the first semiconductor layer and a second electrode connected to the second semiconductor layer, a direction from a position of the first electrode to a position of the second electrode (a direction or from a position of the second electrode to a position of the first electrode) may be defined as arrangement directionality of the LED chip 100. Here, the first electrode may be an anode, and the second electrode may be a cathode. The directionality of the LED chip 100 may be defined by a shape of the LED chip 100, if necessary or desired.

FIG. 4 schematically illustrates a wavelength distribution of the LED chips 100 on the growth substrate 10 according to the first embodiment. As shown in FIG. 4, a wavelength variation depending on a growth position occurs between the LED chips 100 due to a process variation and an installation variation in a process for growing the LED chips 100 on the growth substrate 10. As a result of an experiment, a wavelength variation of about 2 nm may occur between the LED chips 100 emitting red light on the growth substrate 10; a wavelength variation of about 3 to 5 nm may occur between the LED chips 100 emitting green light on the growth substrate 10; and a wavelength variation of about 3 nm may occur between the LED chips 100 emitting blue light on the growth substrate 10.

Numbers "1", "2", "3" and "4" written on the LED chips 100 in FIG. 3 indicate the order in which they are picked up by the donor substrate 20. Thus, the LED chips 100 having the same number are simultaneously selected in a pick-up operation of the corresponding order. A pitch PI' between the LED chips 100 of the same number (i.e., the same order) corresponds to a pitch PI" between the LED chips 100 finally transferred to the transfer substrate 30.

In addition, "A", "B", "C" and "D" shown in FIG. 3 each indicate LED chips 100 that are disposed adjacent to one another and have a similar wavelength distribution, as an area for convenience. The LED chips 100 of the numbers "1", "2", "3" and "4" disposed in an area "A" have a relatively similar wavelength distribution, and the LED chips 100 of the numbers "1", "2", "3" and "4" disposed in an area "B" have a relatively similar wavelength distribution. Further, the LED chips 100 of the numbers "1", "2", "3" and "4" disposed in an area "C" have a relatively similar wavelength distribution, and the LED chips 100 of the numbers "1", "2", "3" and "4" disposed in an area "D" have a relatively similar wavelength distribution.

Figure 5A:
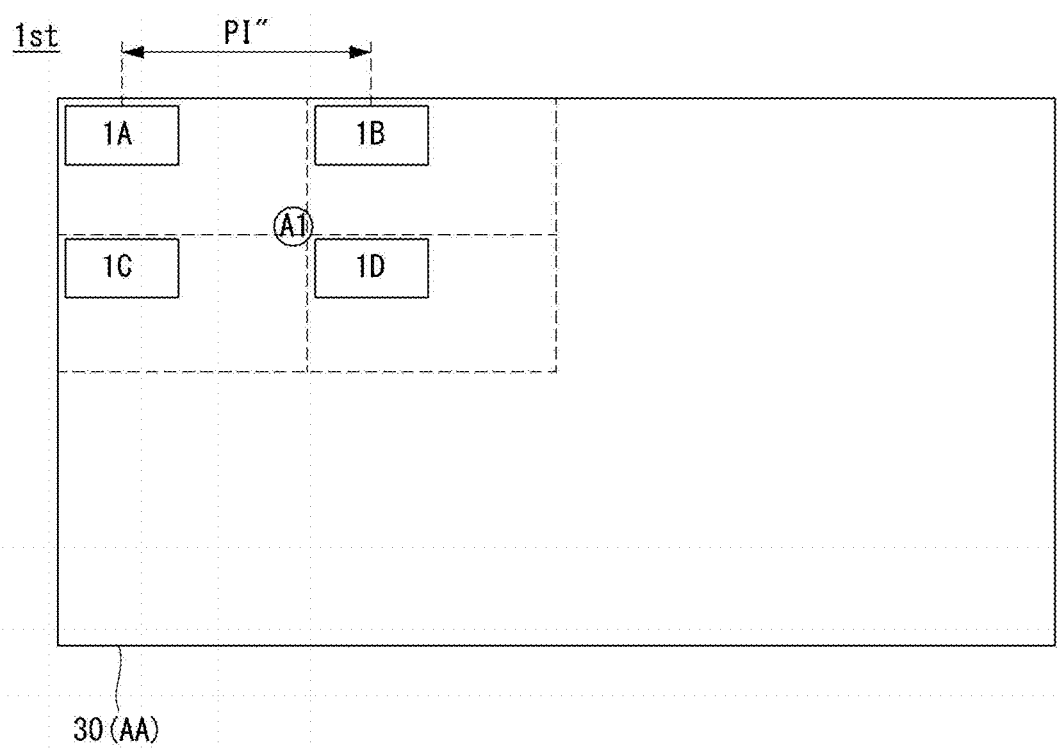
FIGS. 5A to 5D illustrate a method of manufacturing an LED display in time series.
Figure 6:
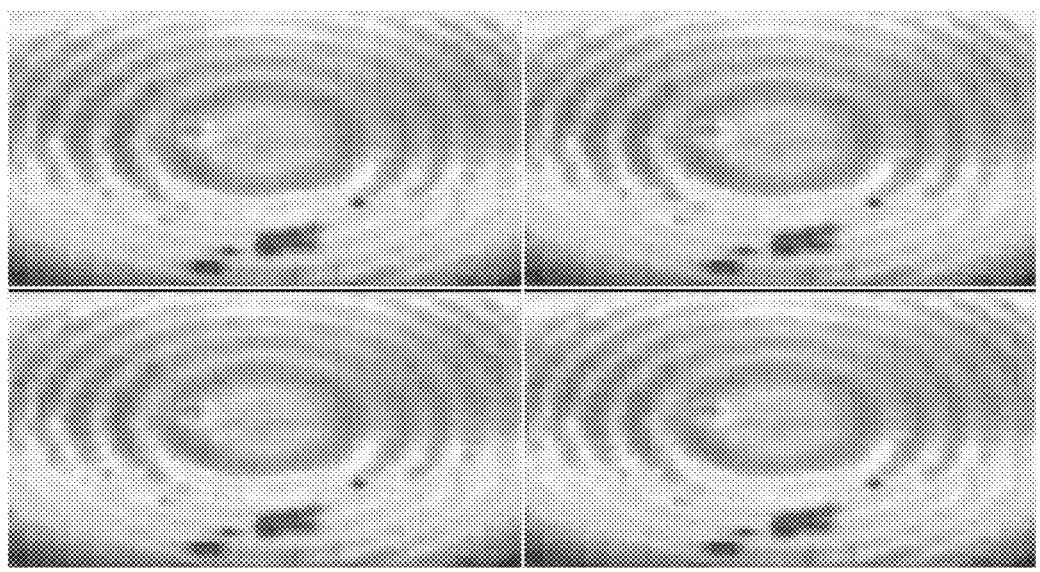
FIG. 6 schematically illustrates a wavelength distribution inside a transfer substrate in a structure shown in FIG. 5D.

As shown in FIG. 5A, the LED chips 100 labeled with the number "1" in the areas A, B, C and D are transferred to preset locations in a first area A1 of the transfer substrate 30 through a first pick-up/transfer process using the donor substrate 20. The LED chips 100 labeled with the number "1" are disposed to be spaced from one another by the preset pitch PI".

Figure 5B:
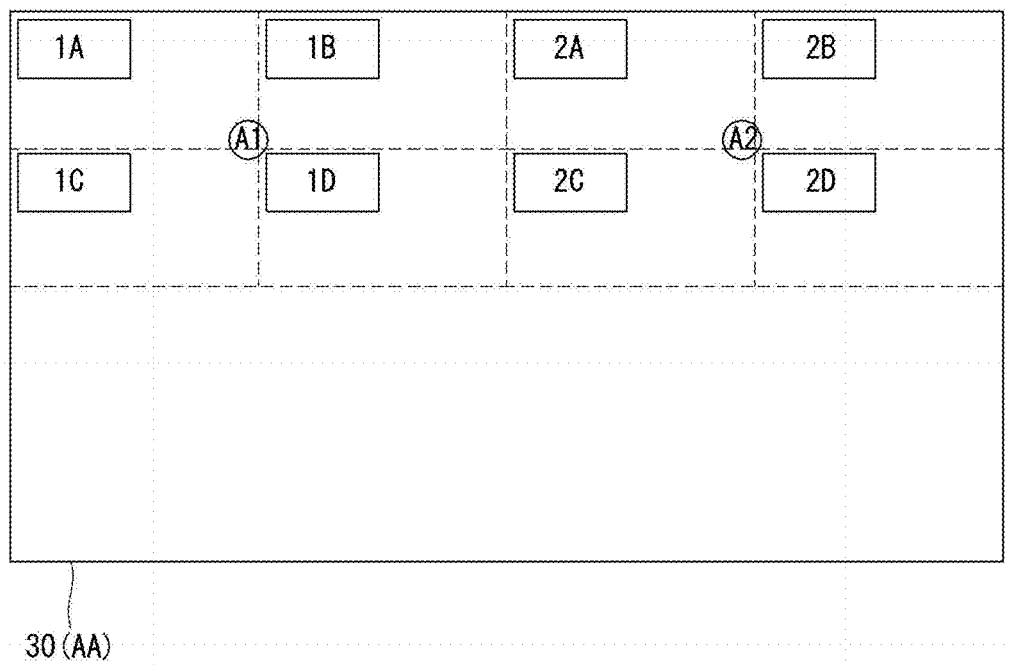

As shown in FIG. 5B, the LED chips 100 labeled with the number "2" in the areas A, B, C and D are transferred to preset locations in a second area A2 of the transfer substrate 30 through a second pick-up/transfer process using the donor substrate 20. The LED chips 100 labeled with the number "2" are disposed to be spaced from one another by the preset pitch PI". The LED chip 100 of the first area A1 and the LED chip 100 of the second area A2, which are disposed adjacent to a boundary between the first area A1 and the second area A2, are disposed to be spaced from each other by a preset pitch.

Figure 5C:
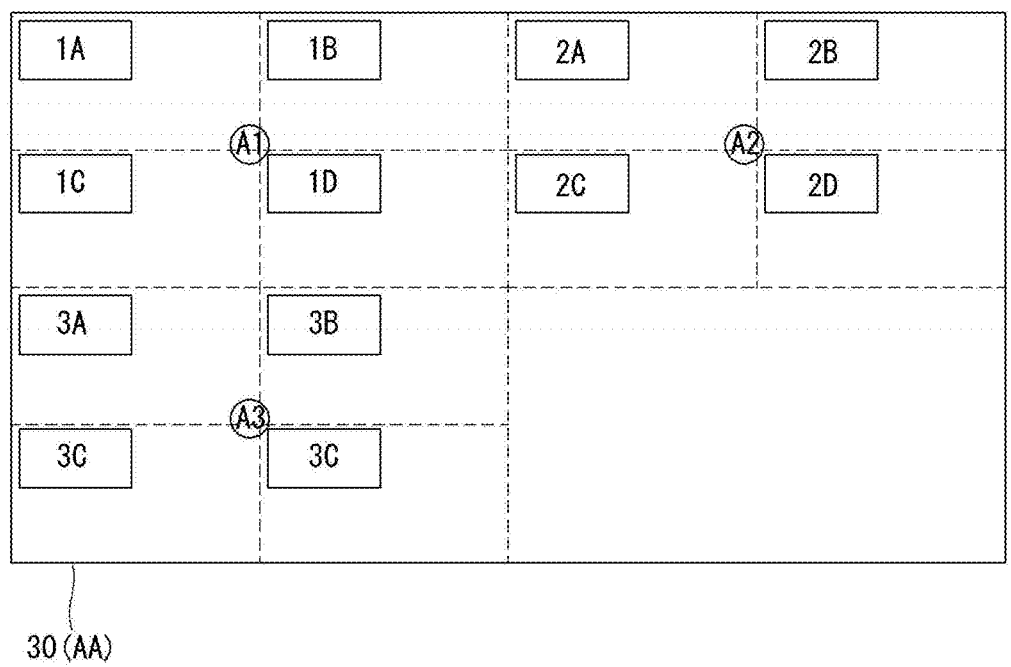

As shown in FIG. 5C, the LED chips 100 labeled with the number "3" in the areas A, B, C and D are transferred to preset locations in a third area A3 of the transfer substrate 30 through a third pick-up/transfer process using the donor substrate 20. The LED chips 100 labeled with the number "3" are disposed to be spaced from one another by the preset pitch PI". The LED chip 100 of the first area A1 and the LED chip 100 of the third area A3, which are disposed adjacent to a boundary between the first area A1 and the third area A3, are disposed to be spaced from each other by a preset pitch.

Figure 5D:
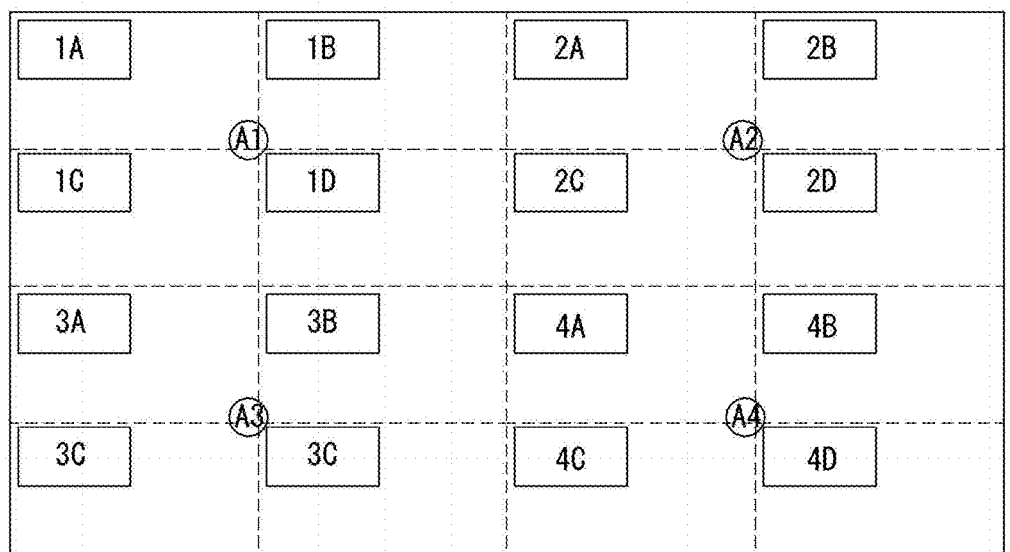

As shown in FIG. 5D, the LED chips 100 labeled with the number "4" in the areas A, B, C and D are transferred to preset locations in a fourth area A4 of the transfer substrate 30 through a fourth pick-up/transfer process using the donor substrate 20. The LED chips 100 labeled with the number "4" are disposed to be spaced from one another by the preset pitch PI". The LED chip 100 of the second area A2 and the LED chip 100 of the fourth area A4, which are disposed adjacent to a boundary between the second area A2 and the fourth area A4, are disposed to be spaced from each other by a preset pitch. Further, the LED chip 100 of the third area A3 and the LED chip 100 of the fourth area A4, which are disposed adjacent to a boundary between the third area A3 and the fourth area A4, are disposed to be spaced from each other by a preset pitch.

FIG. 6 illustrates wavelength distributions of the LED chips 100 on the transfer substrate 30 in the structure shown in FIG. 5D. As shown in FIG. 6, wavelength distributions of the LED chips 100 on the transfer substrate 30 may have a particular rule. More specifically, each of the first area A1, the second area A2, the third area A3, and the fourth area A4 may have substantially the same wavelength distribution as a wavelength distribution of the LED chips 100 on the growth substrate 10. Because the first area A1, the second area A2, the third area A3, and the fourth area A4 regularly show the same wavelength distribution as the wavelength distribution of the growth substrate 10, a user can clearly perceive boundaries of the first to fourth areas A1, A2, A3 and A4. A boundary perception phenomenon may give a sense of discontinuity and/or a sense of difference to the user viewing the display device, resulting in a significant reduction in image immersion of the user. Thus, a method for reducing the boundary perception phenomenon needs to be proposed.

Second Embodiment

A second example embodiment of the disclosure proposes a method for irregularly arranging LED chips having a similar wavelength distribution on a transfer substrate, in order to reduce a boundary perception phenomenon. Namely, the second embodiment of the disclosure proposes a method for irregularly distributing LED chips having a similar wavelength distribution on a transfer substrate while arranging the LED chips with directionality toward one direction on the transfer substrate.

It is possible to consider a simple method for selectively picking up LED chips grown on a growth substrate one by one and irregularly arranging the LED chips on a transfer substrate. However, because the LED chips applied to embodiments of the disclosure are micro-elements of micro-size, there is a process limit to selectively picking up the LED chips one by one. In this instance, because a pick-up/transfer operation has to be repeatedly performed a number of times corresponding to the number of pixels, an increase in manufacturing time and manufacturing cost, a reduction in yield, and the like may be caused.

Figure 7:
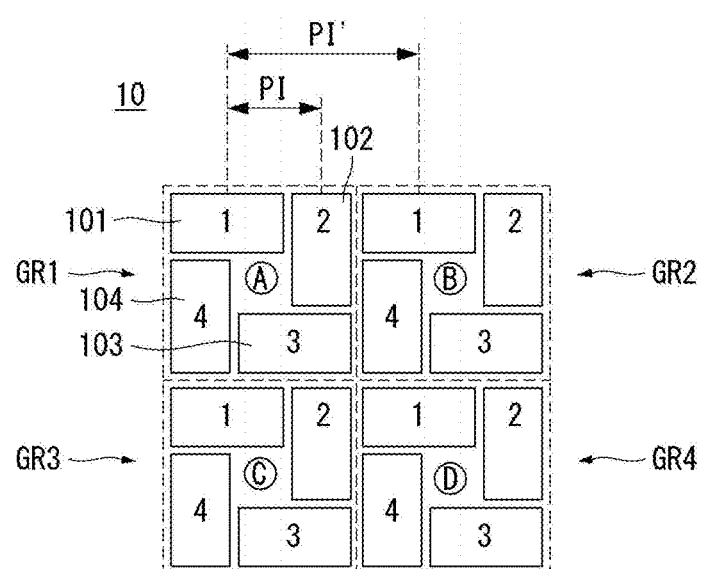
FIG. 7 schematically illustrates a growth substrate according to a second example embodiment on which LED chips are grown.
Figure 9:
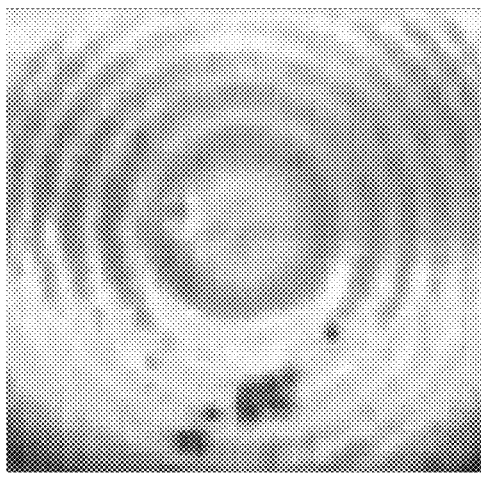
FIG. 9 schematically illustrates a wavelength distribution inside a growth substrate.
Figure 10:
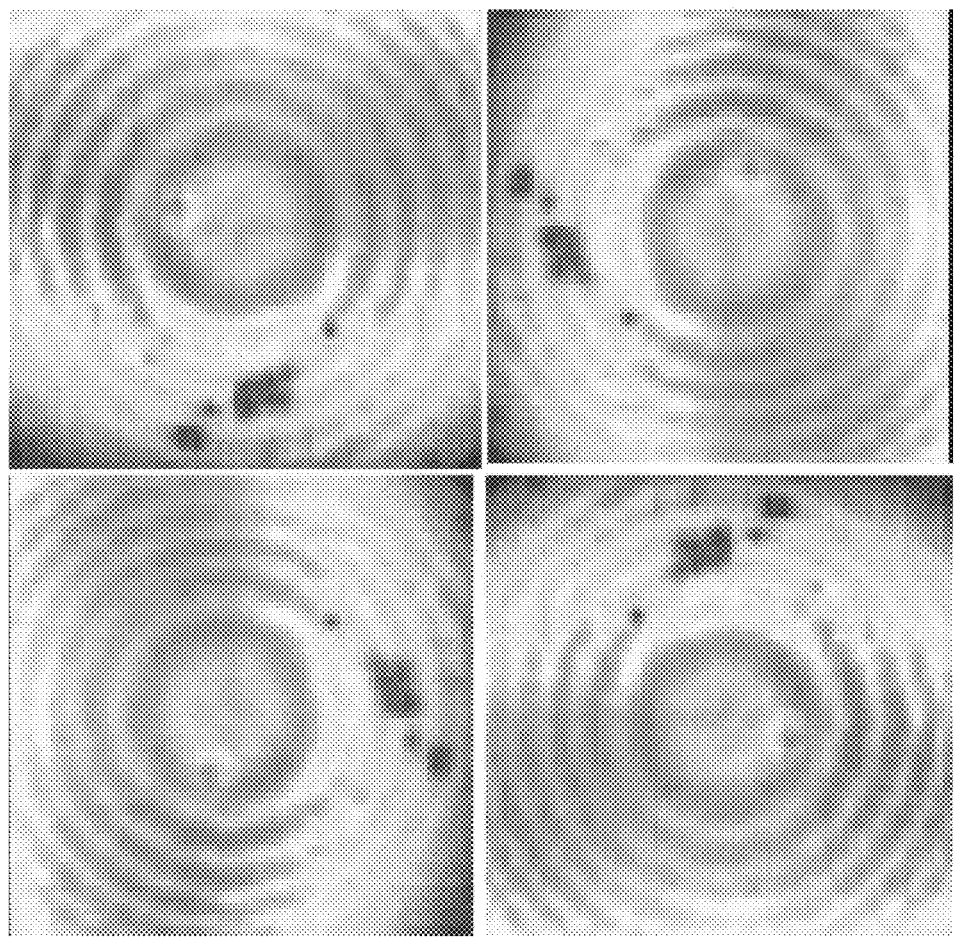
FIG. 10 schematically illustrates a wavelength distribution inside a transfer substrate in a final structure shown in FIG. 8D.

FIG. 7 schematically illustrates a growth substrate according to a second example embodiment on which LED chips are grown. FIGS. 8A to 8D illustrate a method of manufacturing an LED display in time series. FIG. 9 schematically illustrates a wavelength distribution inside a growth substrate. FIG. 10 schematically illustrates a wavelength distribution inside a transfer substrate in a final structure shown in FIG. 8D. In the description of the second embodiment, a description of the substantially same configuration as the first embodiment is omitted.

Referring to FIG. 7, a plurality of LED chips 100 of micro-size is formed on a growth substrate 10 through a growth process. Hereinafter, an example where sixteen LED chips 100 are arranged on the growth substrate 10 is described for convenience of explanation. A separation pitch PI between the LED chips 100 on the growth substrate 10 may be set to as small a pitch as possible in the process.

In the second embodiment, the LED chips 100 having different directionalities are grown, unlike the first embodiment. For example, the growth substrate 10 according to the second embodiment may include a first LED chip 101 and a second LED chip 102 each having different directionality.

The directionality of the LED chip 100 may be defined as a direction in which a current flows. For example, when the LED chip 100 has a P-N junction structure, a direction from a first semiconductor layer to a second semiconductor layer in which a current flows may be defined as arrangement directionality of the LED chip 100. As another example, when the LED chip 100 has a first electrode connected to the first semiconductor layer and a second electrode connected to the second semiconductor layer, a direction from a position of the first electrode to a position of the second electrode (a direction or from a position of the second electrode to a position of the first electrode) may be defined as arrangement directionality of the LED chip 100. Here, the first electrode may be an anode, and the second electrode may be a cathode. The directionality of the LED chip 100 may be defined by a shape of the LED chip 100, if necessary or desired.

More specifically, the growth substrate 10 according to the second embodiment includes the LED chips 100 grown on one surface. The LED chips 100 may be divided into a first group GR1, a second group GR2, a third group GR3, and a fourth group GR4 each including at least n LED chips 100, where n is an integer equal to or greater than 2.

The first group GR1, the second group GR2, the third group GR3, and the fourth group GR4 may be arranged in a matrix. The second group GR2 may be disposed adjacent to the first group GR1 in a first direction, and the third group GR3 may be disposed adjacent to the first group GR1 in a second direction. The fourth group GR4 may be disposed adjacent to the third group GR3 in the first direction and may be disposed adjacent to the second group GR2 in the second direction.

Each of the first group GR1, the second group GR2, the third group GR3, and the fourth group GR4 includes the first LED chip 101 arranged with directionality toward the first direction and the second LED chip 102 with directionality toward the second direction. An angle formed by a first imaginary line extended in the first direction and a second imaginary line extended in the second direction is a right angle. This indicates that when the first LED chip 101 is tilted by 90°, the first LED chip 101 is arranged with the same directionality as the second LED chip 102.

FIG. 7 illustrates that each of the first group GR1, the second group GR2, the third group GR3, and the fourth group GR4 includes a total of four LED chips including the first LED chip 101, the second LED chip 102, a third LED chip 103, and a fourth LED chip 104, for convenience of explanation by way of example. However, embodiments are not limited thereto. The LED chips 100 of the same number in each group are simultaneously picked up. Namely, the numbers given to the LED chips 100 indicate the order in which they are picked up by a donor substrate 20, and the LED chips 100 having the same number are simultaneously selected in a pick-up operation of the corresponding order.

The first LED chip 101 is arranged with the directionality toward the first direction. The second LED chip 102 is arranged with the directionality toward the second direction and corresponds to a configuration obtained by titling the first LED chip 101 by 90°. The third LED chip 103 is arranged with the directionality toward the first direction and corresponds to a configuration obtained by titling the second LED chip 102 by 90°. The fourth LED chip 104 is arranged with the directionality toward the second direction and corresponds to a configuration obtained by titling the third LED chip 103 by 90°.

For example, the first LED chips 101 included in the first group GR1, the second group GR2, the third group GR3, and the fourth group GR4 are simultaneously selected, picked up, and transported in a first pick-up operation of the donor substrate 20 and are transferred to pixels on a transfer substrate 30 with predetermined directionality (for example, the first direction). The second LED chips 102 included in the first group GR1, the second group GR2, the third group GR3, and the fourth group GR4 are simultaneously selected, picked up, and transported in a second pick-up operation of the donor substrate 20 and are transferred to pixels on the transfer substrate 30 with predetermined directionality (for example, the first direction). The third LED chips 103 included in the first group GR1, the second group GR2, the third group GR3, and the fourth group GR4 are simultaneously selected, picked up, and transported in a third pick-up operation of the donor substrate 20 and are transferred to pixels on the transfer substrate 30 with predetermined directionality (for example, the first direction). The fourth LED chips 104 included in the first group GR1, the second group GR2, the third group GR3, and the fourth group GR4 are simultaneously selected, picked up, and transported in a fourth pick-up operation of the donor substrate 20 and are transferred to pixels on the transfer substrate 30 with predetermined directionality (for example, the first direction).

The LED chips 104 that are finally arranged in the pixels on the transfer substrate 30 have the same directionality. Thus, directionality of the LED chips 100 on the growth substrate 10, which is different from the directionality of the LED chips 100 transferred to the transfer substrate 30, is adjusted, and then the LED chips 100 on the growth substrate 10 need to be transferred to the transfer substrate 30. This is described in detail below with reference to FIGS. 8A to 8D.

Figure 8A:
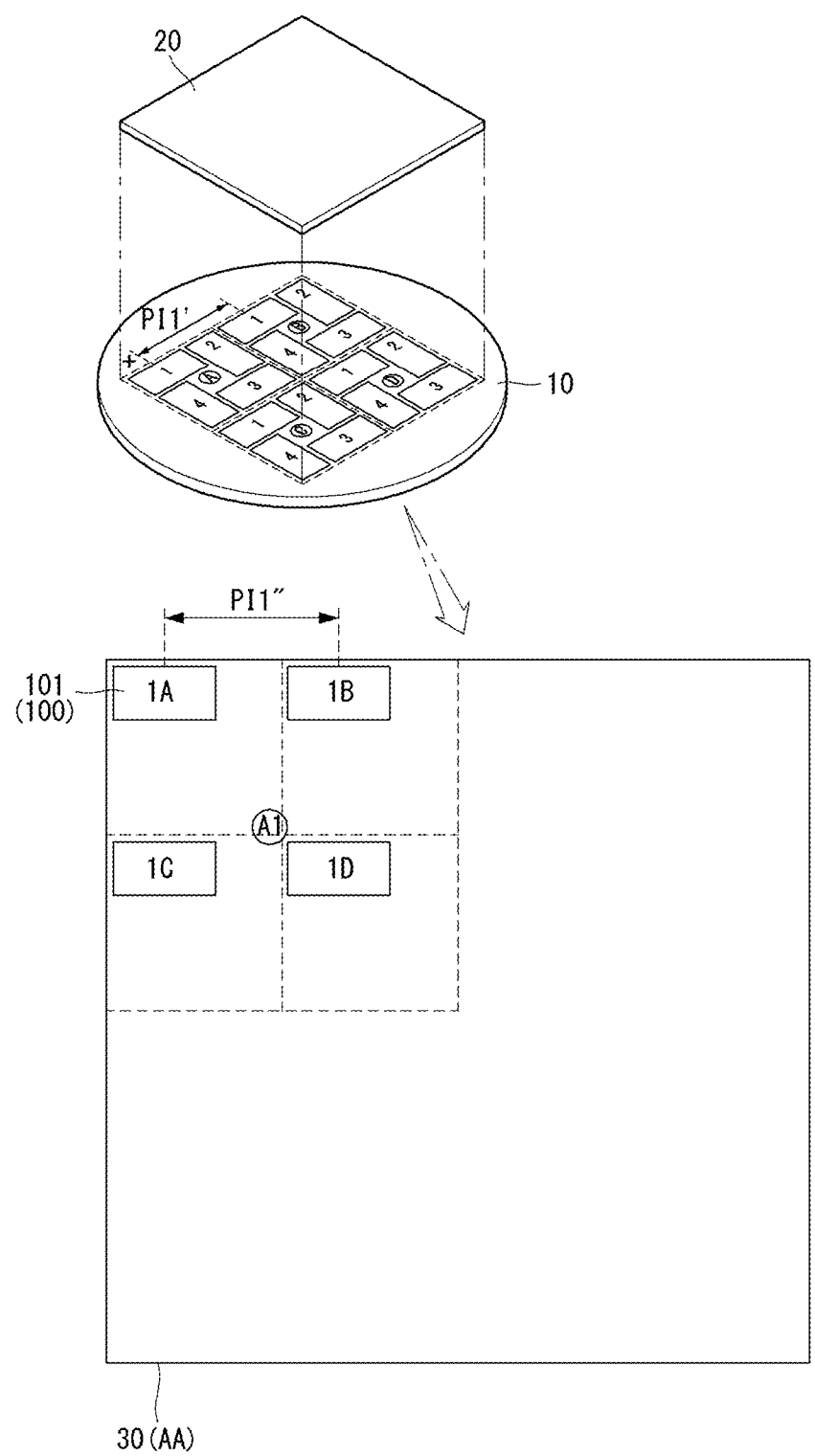
FIGS. 8A to 8D illustrate a method of manufacturing an LED display in time series.

As shown in FIG. 8A, the first LED chips 101 of the first group GR1, the second group GR2, the third group GR3, and the fourth group GR4 are transferred to preset locations in a first area A1 of the transfer substrate 30 through a first pick-up/transfer process using the donor substrate 20. A pitch PI1' between the first LED chips 101 on the growth substrate 10 corresponds to a pitch PI1" between the first LED chips 101 finally transferred to the transfer substrate 30.

Figure 8B:
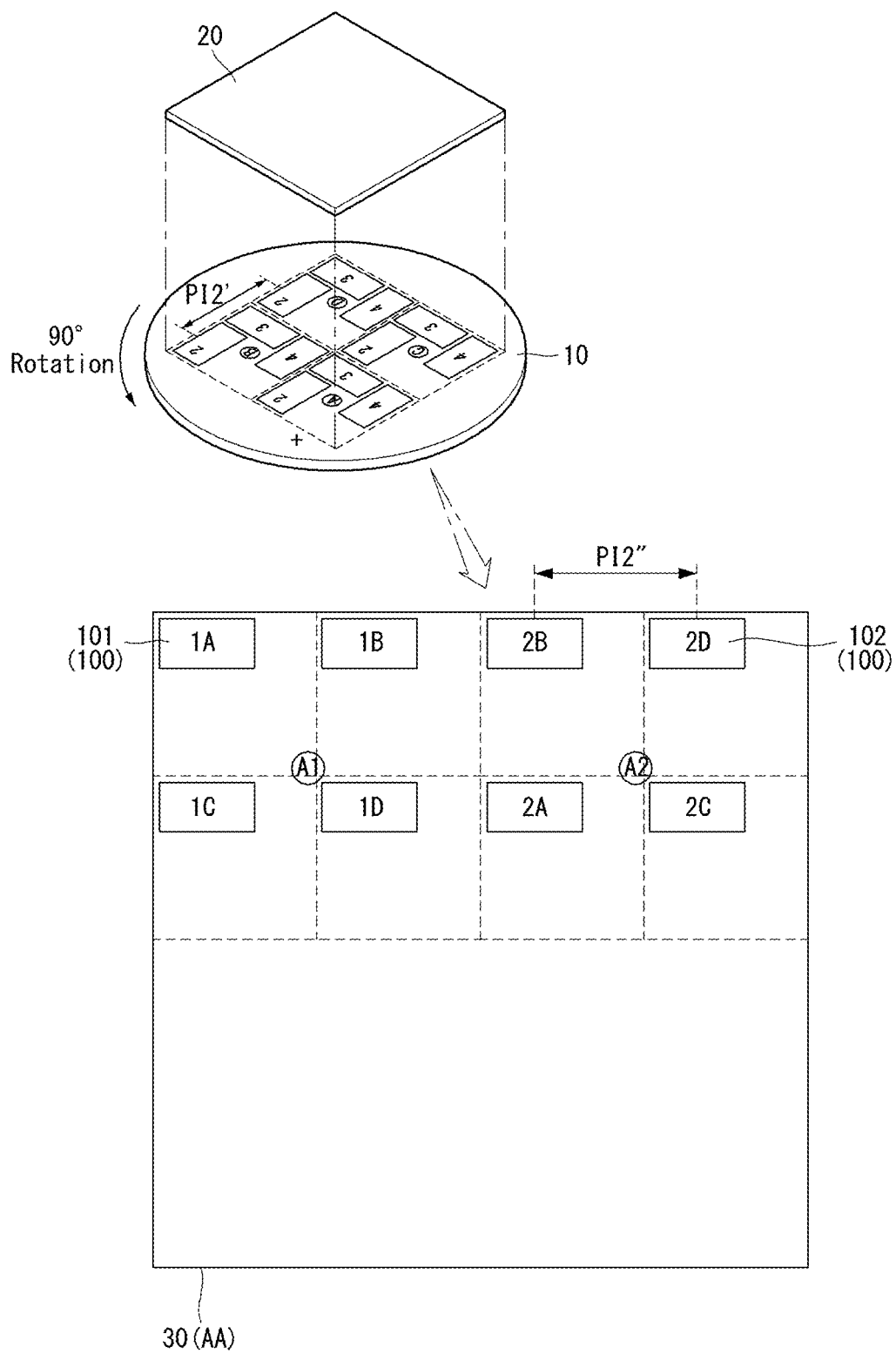

As shown in FIG. 8B, the second LED chips 102 of the first group GR1, the second group GR2, the third group GR3, and the fourth group GR4 are transferred to preset locations in a second area A2 of the transfer substrate 30 through a second pick-up/transfer process using the donor substrate 20. Before the second pick-up/transfer process using the donor substrate 20, the growth substrate 10 is rotated by 90°. Hence, directionalities of the second LED chips 102, the third LED chips 103, and the fourth LED chips 104 are changed.

The directionality of the second LED chips 102 on the rotated growth substrate 10 is changed to the first direction. The donor substrate 20 picks up and transports the second LED chips 102, of which the directionality is changed, and then transfers the second LED chips 102 to corresponding pixels of the transfer substrate 30 with the directionality toward the first direction. A pitch PI2' between the second LED chips 102 on the growth substrate 10 corresponds to a pitch PI2" between the second LED chips 102 finally transferred to the transfer substrate 30. Reference mark "+" in FIGS. 8A to 8D is arbitrarily denoted so that a rotation direction and a rotation degree of the growth substrate 10 can be known.

Figure 8C:
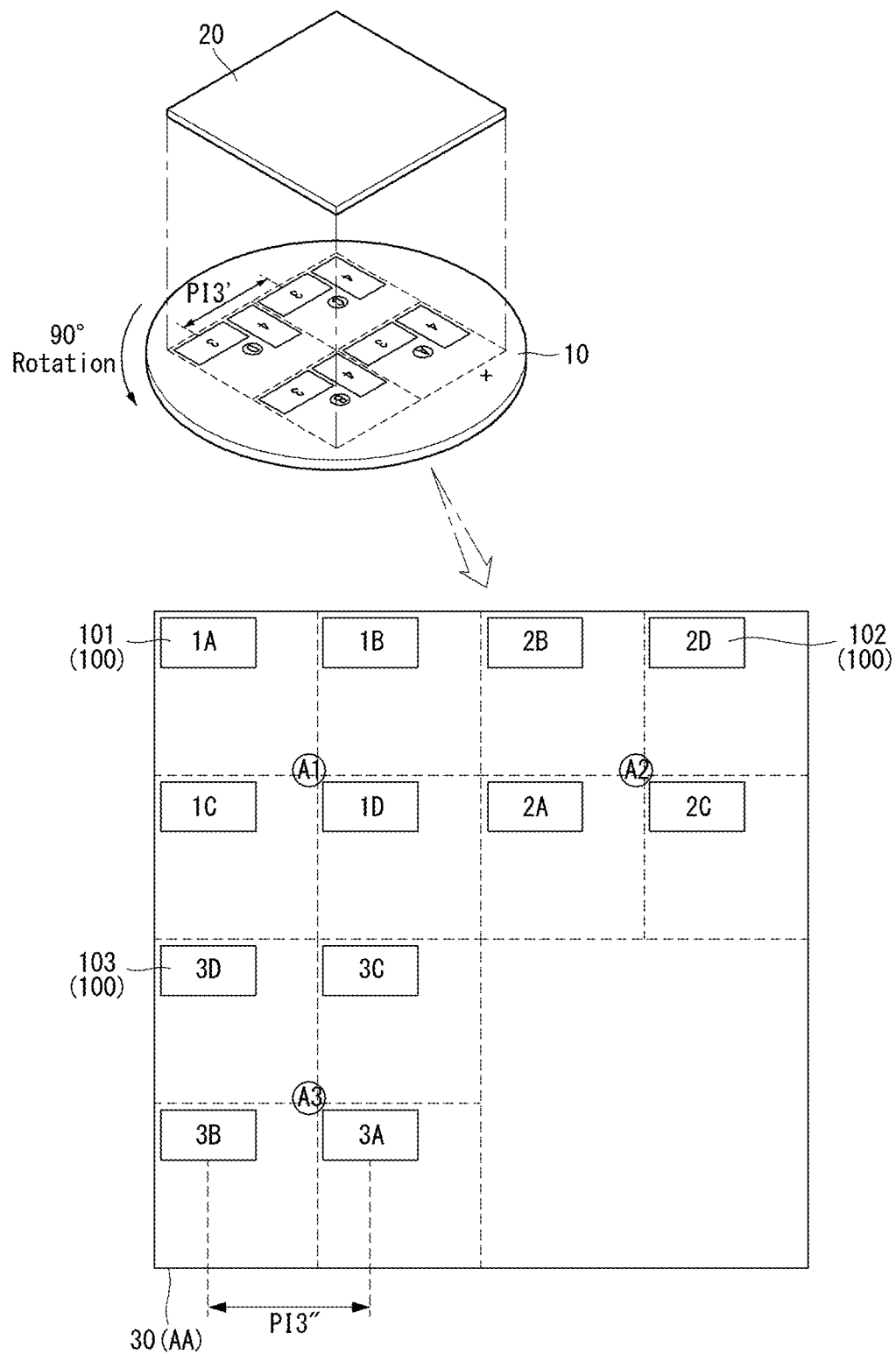

As shown in FIG. 8C, the third LED chips 103 of the first group GR1, the second group GR2, the third group GR3, and the fourth group GR4 are transferred to preset locations in a third area A3 of the transfer substrate 30 through a third pick-up/transfer process using the donor substrate 20. Before the third pick-up/transfer process using the donor substrate 20, the growth substrate 10 is rotated by 90°. Hence, directionalities of the third LED chips 103 and the fourth LED chips 104 are changed.

The directionality of the third LED chips 103 on the rotated growth substrate 10 is changed to the first direction. The donor substrate 20 picks up and transports the third LED chips 103, of which the directionality is changed, and then transfers the third LED chips 103 to corresponding pixels of the transfer substrate 30 with the directionality toward the first direction. A pitch PI3' between the third LED chips 103 on the growth substrate 10 corresponds to a pitch PI3" between the third LED chips 103 finally transferred to the transfer substrate 30.

Figure 8D:
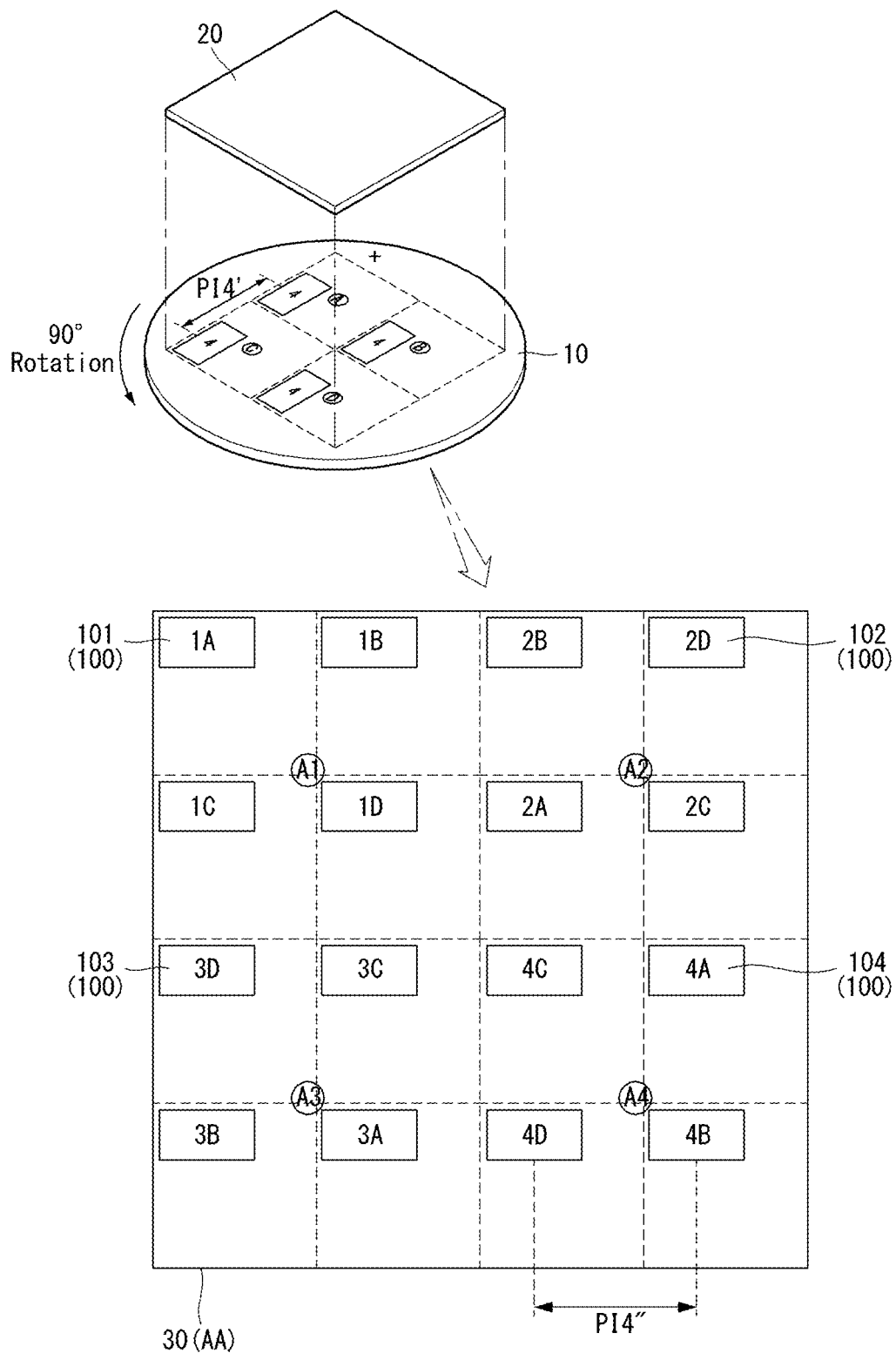

As shown in FIG. 8D, the fourth LED chips 104 of the first group GR1, the second group GR2, the third group GR3, and the fourth group GR4 are transferred to preset locations in a fourth area A4 of the transfer substrate 30 through a fourth pick-up/transfer process using the donor substrate 20. Before the fourth pick-up/transfer process using the donor substrate 20, the growth substrate 10 is rotated by 90°. Hence, directionality of the fourth LED chips 104 is changed.

The directionality of the fourth LED chips 104 on the rotated growth substrate 10 is changed to the first direction. The donor substrate 20 picks up and transports the fourth LED chips 104, of which the directionality is changed, and then transfers the fourth LED chips 104 to corresponding pixels of the transfer substrate 30 with the directionality toward the first direction. A pitch PI4' between the fourth LED chips 104 on the growth substrate 10 corresponds to a pitch PI4" between the fourth LED chips 104 finally transferred to the transfer substrate 30.

Referring again to FIG. 7, "A", "B", "C" and "D" shown in FIG. 7 each indicate LED chips 100 that are disposed adjacent to one another and have a similar wavelength distribution, as an area for convenience. The areas "A", "B", "C" and "D" may correspond to the first group GR1, the second group GR2, the third group GR3, and the fourth group GR4, respectively. The first to fourth LED chips 101, 102, 103 and 104 in the area "A" have a relatively similar wavelength distribution, and the first to fourth LED chips 101, 102, 103 and 104 in the area "B" have a relatively similar wavelength distribution. Further, the first to fourth LED chips 101, 102, 103 and 104 in the area "C" have a relatively similar wavelength distribution, and the first to fourth LED chips 101, 102, 103 and 104 in the area "D" have a relatively similar wavelength distribution. FIG. 9 schematically illustrates a wavelength distribution of the LED chips 100 on the growth substrate 10 according to the second embodiment.

As described above, in the second embodiment of the disclosure, because the LED chips 100 on the growth substrate 10 are disposed with different directionalities, the directionalities of the LED chips 100 on the growth substrate 10 need to be properly changed so that the LED chips 100 are arranged on the transfer substrate 30 with one directionality. Hence, the second embodiment described an example of rotating the growth substrate 10 before the pick-up operation using the donor substrate 20, in order to change the directionalities of the LED chips 100 on the growth substrate 10. As described above, because an operation of rotating the growth substrate 10 is performed during the manufacturing process, wavelength distributions of the LED chips 100 finally transferred on the transfer substrate 30 are irregular unlike the first embodiment.

Namely, as shown in FIG. 8D and FIG. 10 that illustrates wavelength distributions of the LED chips 100 on the transfer substrate 30 in the structure shown in FIG. 8D, the LED chips 100 having a similar wavelength distribution are not arranged on the transfer substrate 30 like the LED chips of the first embodiment and are arranged in irregularly distributed manner. Hence, the second embodiment of the disclosure can reduce a boundary perception phenomenon in which boundaries of the first area A1, the second area A2, the third area A3, and the fourth area A4 are clearly perceived as described in the first embodiment. As a result, the second embodiment of the disclosure provides an LED display capable of maximizing immersion of the user while providing high quality visual information.

Third Embodiment

Figure 11A:
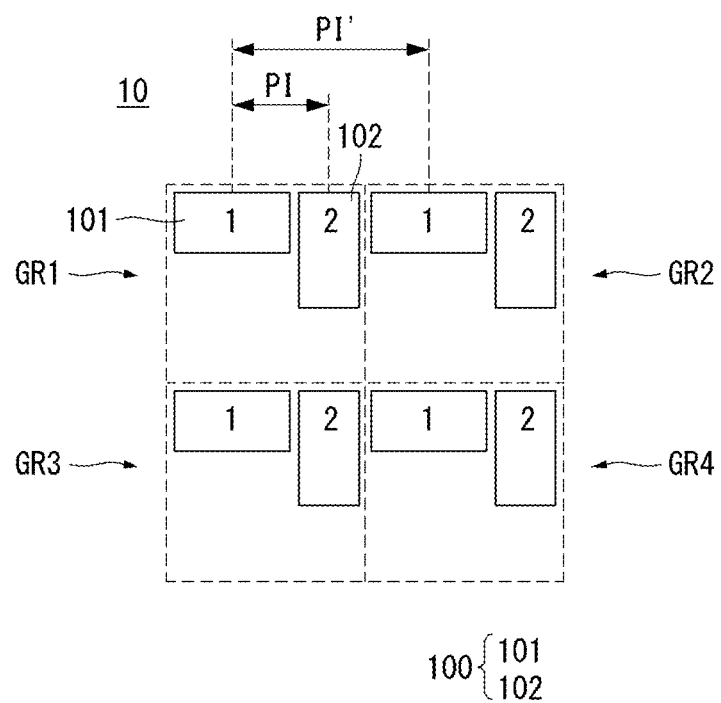
FIGS. 11A and 11B illustrate examples of disposing LED chips grown on a growth substrate according to a third example embodiment.
Figure 11B:
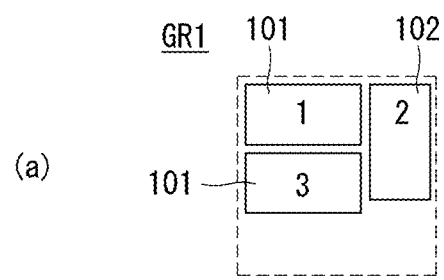
Figure 11B:
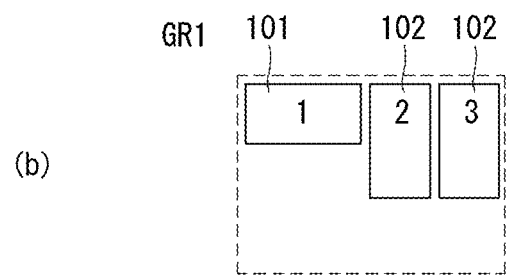
Figure 11B:
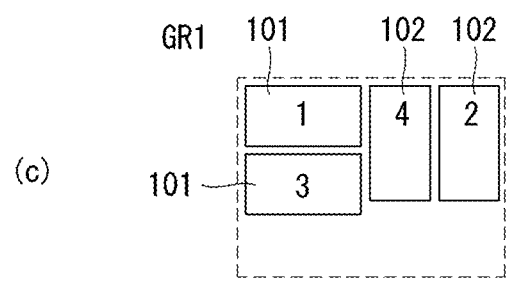

FIGS. 11A and 11B illustrate examples of disposing LED chips grown on a growth substrate according to a third example embodiment. In the description of the third embodiment, a description of the substantially same configuration as the second embodiment is omitted.

Referring to FIG. 11A, in the third embodiment, LED chips 100 having different directionalities are grown. For example, a growth substrate 10 according to the third embodiment may include a first LED chip 101 and a second LED chip 102 each having different directionality.

More specifically, the growth substrate 10 according to the third embodiment includes the LED chips 100 grown on one surface. The LED chips 100 may be divided into a first group GR1, a second group GR2, a third group GR3, and a fourth group GR4 each including at least n LED chips 100, where n is an integer equal to or greater than 2. The second group GR2 may be disposed adjacent to the first group GR1 in a first direction, and the third group GR3 may be disposed adjacent to the first group GR1 in a second direction. The fourth group GR4 may be disposed adjacent to the third group GR3 in the first direction and may be disposed adjacent to the second group GR2 in the second direction.

Each of the first group GR1, the second group GR2, the third group GR3, and the fourth group GR4 includes the first LED chip 101 arranged with directionality toward the first direction and the second LED chip 102 arranged with directionality toward the second direction. An angle formed by a first imaginary line extended in the first direction and a second imaginary line extended in the second direction is a right angle. This indicates that when the first LED chip 101 is tilted by 90°, the first LED chip 101 is arranged with the same directionality as the second LED chip 102.

FIG. 11B is a modified example of FIG. 11A and schematically illustrates a structure of the first group GR1. The second group GR2, the third group GR3, and the fourth group GR4 each may have the same structure as the first group GR1.

For example, as shown in (a) of FIG. 11B, the first group GR1 may include p first LED chips 101, where p is an integer equal to or greater than 2. As another example, as shown in (b) of FIG. 11B, the first group GR1 may include q second LED chips 102, where q is an integer equal to or greater than 2. As another example, as shown in (c) of FIG. 11B, the first group GR1 may include p first LED chips 101 and q second LED chips 102.

The LED chips 100 having the same number in the groups are simultaneously picked up. Namely, the numbers given to the LED chips 100 indicate the order in which they are picked up by a donor substrate 20, and the LED chips 100 having the same number are simultaneously selected in a pick-up operation of the corresponding order. The LED chips 100 picked up by the donor substrate 20 are transferred to corresponding pixels on a transfer substrate 30.

The embodiments of the disclosure can efficiently manufacture the relatively large-sized LED display using the relatively small-sized growth substrate. Furthermore, the embodiments of the disclosure can manufacture the LED display with the significantly improved immersion of the user by efficiently reducing the boundary perception phenomenon that may occur during the manufacturing process of the LED display.

It will be apparent to those skilled in the art that various modifications and variations can be made in the growth substrate including micro-light emitting diode chips and the method of manufacturing a light emitting diode display using the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A method of manufacturing a light emitting diode display, the method comprising:
   providing a growth substrate on which light emitting diode (LED) chips are grown, the LED chips being at least divided into first to fourth groups; and
   providing a transfer substrate on which pixels having a preset pitch are arranged,
   wherein the first to fourth groups are arranged in a matrix,
   wherein each of the first to fourth groups comprises:
      a first LED chip in which a current flows in a first direction, and
      a second LED chip in which a current flows in a second direction different from the first direction.

2. The method of claim 1, wherein an angle formed by a first imaginary line extended in the first direction and a second imaginary line extended in the second direction is a right angle.

3. The method of claim 1, further comprising:
   providing a donor substrate configured to selectively pick up some of the LED chips in which the current flows the same direction among the first to fourth groups; and
   transferring the picked-up LED chips to corresponding pixels on the transfer substrate.

4. The method of claim 3, wherein the providing of the donor substrate comprises:
   selectively picking up the first LED chips of the first to fourth groups through a first pick-up operation using the donor substrate; and
   transferring the picked-up first LED chips to corresponding pixels of the transfer substrate.

5. The method of claim 4, wherein the providing of the donor substrate further comprises:
   rotating the growth substrate by 90° to change a directionality of the second LED chips of the first to fourth groups to the first direction;
   selectively picking up the second LED chips of the first to fourth groups through a second pick-up operation using the donor substrate; and
   transferring the picked-up second LED chips to corresponding pixels of the transfer substrate.

6. The method of claim 5, wherein a pitch between the first LED chips grown on the growth substrate is equal to a pitch between the first LED chips transferred to the transfer substrate.

7. The method of claim 6, wherein a pitch between the second LED chips grown on the growth substrate is equal to a pitch between the second LED chips transferred to the transfer substrate.

8. The method of claim 1, wherein a pitch between the first LED chip and the second LED chip grown on the growth substrate is less than a pitch between the first LED chips or a pitch between the second LED chips transferred to the transfer substrate.

9. The method of claim 1, wherein the providing of the transfer substrate comprises forming a thin film transistor assigned to each of the pixels.

* * * * *

UNITED STATES PATENT AND TRADEMARK OFFICE
CERTIFICATE OF CORRECTION

PATENT NO. : 10,804,425 B2  
APPLICATION NO. : 16/037174  
DATED : October 13, 2020  
INVENTOR(S) : Joonkwon Moon Page 1 of 1

It is certified that error appears in the above-identified patent and that said Letters Patent is hereby corrected as shown below:

On the Title Page

Column 1, Item (73), should read:  
--(73) Assignees: LG Display Co., Ltd., Seoul (KR); LG Electronics Inc., Seoul (KR)--

Signed and Sealed this  
Twenty-second Day of December, 2020

Andrei Iancu  
*Director of the United States Patent and Trademark Office*